(12) United States Patent
Ruotsalainen et al.

(10) Patent No.: US 6,768,437 B1
(45) Date of Patent: Jul. 27, 2004

(54) SWITCHED VOLTAGE-MODE DITHER SIGNAL GENERATION FOR A SIGMA-DELTA MODULATOR

(75) Inventors: Tarmo Ruotsalainen, Oulu (FI); Elvi Räisänen-Ruotsalainen, Oulu (FI); Vesa Korkala, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/603,893

(22) Filed: Jun. 24, 2003

(51) Int. Cl.⁷ .............................................. H03M 3/00
(52) U.S. Cl. ...................................... 341/143; 341/155
(58) Field of Search .............................. 341/143, 155, 341/144

(56) References Cited

U.S. PATENT DOCUMENTS

| | | | |
|---|---|---|---|
| 4,611,195 A | 9/1986 | Shosaku | 340/347 DA |
| 4,751,496 A | 6/1988 | Araki et al. | 340/347 AD |
| 4,857,927 A | 8/1989 | Takabayashi | 341/131 |
| 4,937,576 A | 6/1990 | Yoshio et al. | 341/131 |
| 5,227,795 A * | 7/1993 | Yamakido et al. | 341/166 |
| 5,745,061 A | 4/1998 | Norsworthy et al. | 341/131 |
| 5,790,063 A * | 8/1998 | Koifman et al. | 341/155 |
| 5,889,482 A | 3/1999 | Zarubinsky et al. | 341/131 |
| 5,990,819 A | 11/1999 | Fujimori | 341/150 |
| 6,011,501 A | 1/2000 | Gong et al. | 341/150 |
| 6,326,911 B1 | 12/2001 | Gomez et al. | 341/143 |

FOREIGN PATENT DOCUMENTS

WO   WO-9844626   8/1998

* cited by examiner

*Primary Examiner*—Brian Young
(74) *Attorney, Agent, or Firm*—Harrington & Smith, LLP

(57) ABSTRACT

A sigma-delta modulator (10) has an input node coupled to a first input of a loop filter (12); a quantizer (14) that has an input coupled to an output of the loop filter for receiving a differential input signal therefrom and a feedback path (18) coupled from an output of the quantizer to a second input of the loop filter. The quantizer input includes a first input signal transistor (14A) and a second input signal transistor (14B) having gates coupled to the differential input signal, a first set of transistors (M1a, . . . ,Mna) connected in parallel with the first input signal transistor (M0a), and a second set of transistors (M1b, . . . ,Mnb) connected in parallel with the second input signal transistor (M0b). A gate of each transistor of the first set of transistors is switchably coupled by a digital signal to either the input signal or to ground, and a gate of each transistor of the second set of dither transistors is switchably coupled by an inverted version of the digital signal to either the input signal or to ground. The digital signal is generated to have random or pseudo-random characteristics, such as by using a LFSR (20). The result is the creation of an imbalance in the quantizer input transistor structure that results in the generation of a noise signal that functions as a dither signal.

16 Claims, 3 Drawing Sheets

SWITCHED VOLTAGE-MODE DITHER SIGNAL GENERATION FOR A SIGMA-DELTA MODULATOR

FIELD OF THE INVENTION

This invention relates generally to sigma-delta (SD) modulators and, more specifically, to SD modulators used in, for example, analog-to-digital converter circuitry, and that employ a dither signal to suppress the generation of undesirable tones.

BACKGROUND OF THE INVENTION

The development of semiconductor technologies is currently driven by the needs of digital circuits and applications, such as microprocessors and memories. In these applications one of the main goals is to increase the signal processing power, which can be achieved by increasing the number of transistors per integrated circuit and the speed of operation, and the semiconductor technologies are developed accordingly.

From a cost point of view it is often desirable to reduce the number of components in a system. One effective technique to achieve the desired reduction in component count is to integrate the analog portions of the system on the same integrated circuit with the digital circuitry. Unfortunately, the current, state-of-the-art digital deep submicron CMOS processes are not well suited for analog applications. There are a number of reasons for this, including: a reduction in the maximum power supply voltages; the analog properties of active devices, such as noise and early voltage, are optimized for digital, not analog, applications; and the variety of available devices is limited, especially passive devices which are available only by incurring additional and expensive fabrication process steps.

The integration of high performance analog circuitry in these digital processes necessitates the use of suitable circuit techniques and structures. One of these techniques is based on the sigma-delta (SD) principle, which can be used in, for example, analog to digital converters (ADCs), digital to analog converters (DACs), as well as in frequency synthesizers.

From implementation and performance points of view the SD modulators (SDMs) have several favorable properties as compared to competing techniques, but they also exhibit a few weaknesses, one of them being that SDMs suffer from the generation of tones (extraneous signals), the amplitude and frequency of which depend on the amplitude and frequency of the input signal. A common way to avoid the generation of these undesirable tones is to keep the input signal in the input to the quantizer of the SD modulator sufficiently active by adding a dither signal to the SDM quantizer. The dither signal can be either random or predetermined (e.g., a sine wave or a square wave), and the amplitude may be constant or input signal dependent.

The use of SDMs in ADCs and other devices is very well known in the art. Reference may be had, by example, to S. R. Norsworthy et al., "Delta-Sigma Data Converters", IEEE Press, NY, 1997, and to J. G. Proakis et al., Digital Signal Processing" Third Edition, Prentice-Hall, 1996.

As was noted above, the conventional SDM is known to suffer from the generation of tones, i.e., undesirable signals that manifest themselves as periodic fluctuations, the amplitude and frequency of which are a function of the amplitude and frequency of the input signal. The tones are generated primarily because the quantization noise is not always random, especially when the input signal amplitude and frequency are low. A conventional technique to overcome this problem is to use the dither signal that is added to the input signal. Reference in this regard can be had to U.S. Pat. No. 5,889,482, "Analog-to-Digital Converter Using Dither and Method for Converting Analog Signals to Digital Signals", by M. Zarubinsky et al. The approach of Zarubinsky et al. is to add in the dither signal in the SD modulator, and to then cancel or suppress the dither signal before it reaches the output terminal of the ADC.

Other techniques for generating and using a dither signal in a SDM can be found in, as examples, commonly assigned U.S. Pat. No. 6,445,318 B1, "Method and Apparatus for Providing Signal Dependent Dither Generator for Sigma-Delta Modulator", Antti Ruha, Tarmo Ruotsalainen and Jussi-Pekka Tervaluoto; and U.S. Pat. No. 6,462,685 B1, "Dither Signal Insertion Inversely Proportional to Signal Level in Delta-Sigma Modulators", Vesa Korkala.

Reference can also be made to U.S. Pat. No. 6,326,911 B1, Method and Apparatus for Dithering Idle Channel Tones in Delta-Sigma Analog-to-Digital Converters", by Gomez et al., which adds a random dither signal before quantizing a signal in order to attenuate idle channel tones.

Referring to FIG. 1, there is shown a simplified circuit block diagram of a conventional multi-bit sigma-delta modulator (SDM) 10. The SDM 10 includes an input node for receiving an analog input signal and an output node for outputting a single-bit or a multibit digital output signal. The input signal is applied to a loop filter 12, and from the output of the loop filter 12 to a quantizer 14. As is shown in the above-referenced U.S. Pat. No. 6,445,318 B1, the input signal may also be applied to a (pseudorandom) dither signal generator block 15. The output of block 15 is a dither signal, such as a dither current (Idither), that is applied as a second input to the quantizer 14. The effect is to add pseudo-random noise, i.e., a dither signal, to the quantizer 14. The use of the dither signal is preferred as it reduces the generation of tones in the output signal of the SDM 10 when the input signal amplitude is small, and thereby also increases the dynamic range of the SDM 10. The pseudo-random dither signal generation block 15 may contain at least one linear feedback shift register (LFSR) for controlling a current steering DAC, and hence the amplitude (and polarity) of the dither current signal. The output of the quantizer 14 is applied to a suitable coder 16 that outputs a single-bit or a multiple-bit digital signal, and is also applied to a DAC 18 that forms a feedback path back to a second input of the loop filter 12.

While the various SDMs shown in the above-reference commonly assigned U.S. Patents are all well suited for their intended applications, a need exists to provide even further embodiments of, and improvements in, SDMs that employ a dither signal generator in order to generate the dither signal in a simple manner that makes efficient use of modern digital integrated circuit technology. Further, it is desirable to reduce the amount of circuit area, and the power consumption, that is required to implement the dither signal function.

SUMMARY OF THE PREFERRED EMBODIMENTS

The foregoing and other problems are overcome, and other advantages are realized, in accordance with the presently preferred embodiments of these teachings.

This invention provides a technique to implement dithering at the input of the quantizer of a SDM, such as a switched capacitor (SC) SDM. The teachings of this invention are applicable to both single-bit and multi-bit SDM architectures. A feature of this invention is that the dither signal is added at the input of the quantizer, as opposed to being added further downstream from the quantizer input, or added to the input of an integrator, such as integrators found in the loop filter of the SDM.

This invention operates to generate a randomly varying offset voltage in the input transistors of the quantizer. The time varying offset voltage has the same effect that a voltage mode dither signal connected to the input of the quantizer would have. Normally one attempts to minimize the input offset voltage of amplifiers and comparators by using input transistors with equal dimensions and by optimizing the layout. In accordance with this invention, however, the opposite effect is desired, and is realized by artificially creating over time a mismatch in the dimensions of the input transistors, one thereby creates a time varying offset voltage that functions in a manner analogous to a SDM dither signal.

In accordance with this invention a pair of quantizer input transistors are each divided into a set of several smaller (narrower) transistors that are connected in parallel, and the effective total width of each input transistor, at any given instant in time, is controlled by activating or deactivating individual transistors in the set of transistors separately using the digital output word from one or more linear feedback shift registers. The LFSRs are used to generate pseudo-random digital sequences, and these pseudo-random digital sequences are used to control the connection of the gates of the individual transistors in the quantizer input transistor sets to the input signal (active state) or ground (inactive state of NMOS transistors). The dither amplitude is controlled using at least the dimensions of the individual transistors in the quantizer input transistor sets.

Disclosed is a method of generating, a dither signal in a sigma-delta modulator. The method includes, at an input of a quantizer, dividing each of the input transistors into a set of smaller geometry (e.g., narrower) transistors that are connected in parallel; generating a digital signal having random or pseudo-random characteristics; and activating or deactivating individual transistors of the input transistor sets with the digital signal to generate a time-varying offset voltage that has the same effect as a noise signal that is added to the input of the quantizer. In a preferred embodiment there is a first input signal transistor that is divided into a first set of transistors connected in parallel, and a second input signal transistor that is divided into a second set of transistors connected in parallel. The gate of each individual transistor in each of the first and second sets is switchably coupled by the digital signal to either the input signal (active state) or to a potential, such as ground, that results in the transistor being in an inactive state.

Also disclosed is a sigma-delta modulator having an input node coupled to a first input of a loop filter; a quantizer having an input coupled to an output of the loop filter for receiving a differential input signal therefrom and a feedback path coupled from an output of the quantizer to a second input of the loop filter. In accordance with an aspect of this invention the quantizer input includes a first input signal transistor divided into a first set of transistors connected in parallel, and a second input signal transistor divided into a second set of transistors connected in parallel. The gate of each individual transistor in the first set is switchably coupled by a digital signal to either the input signal (active state) or to ground (inactive state), and the gate of each individual transistor in the second set is switchably coupled by an inverse of the digital signal to either the input signal (active state) or to ground (inactive state). The digital signal is generated to have random or pseudo-random characteristics.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
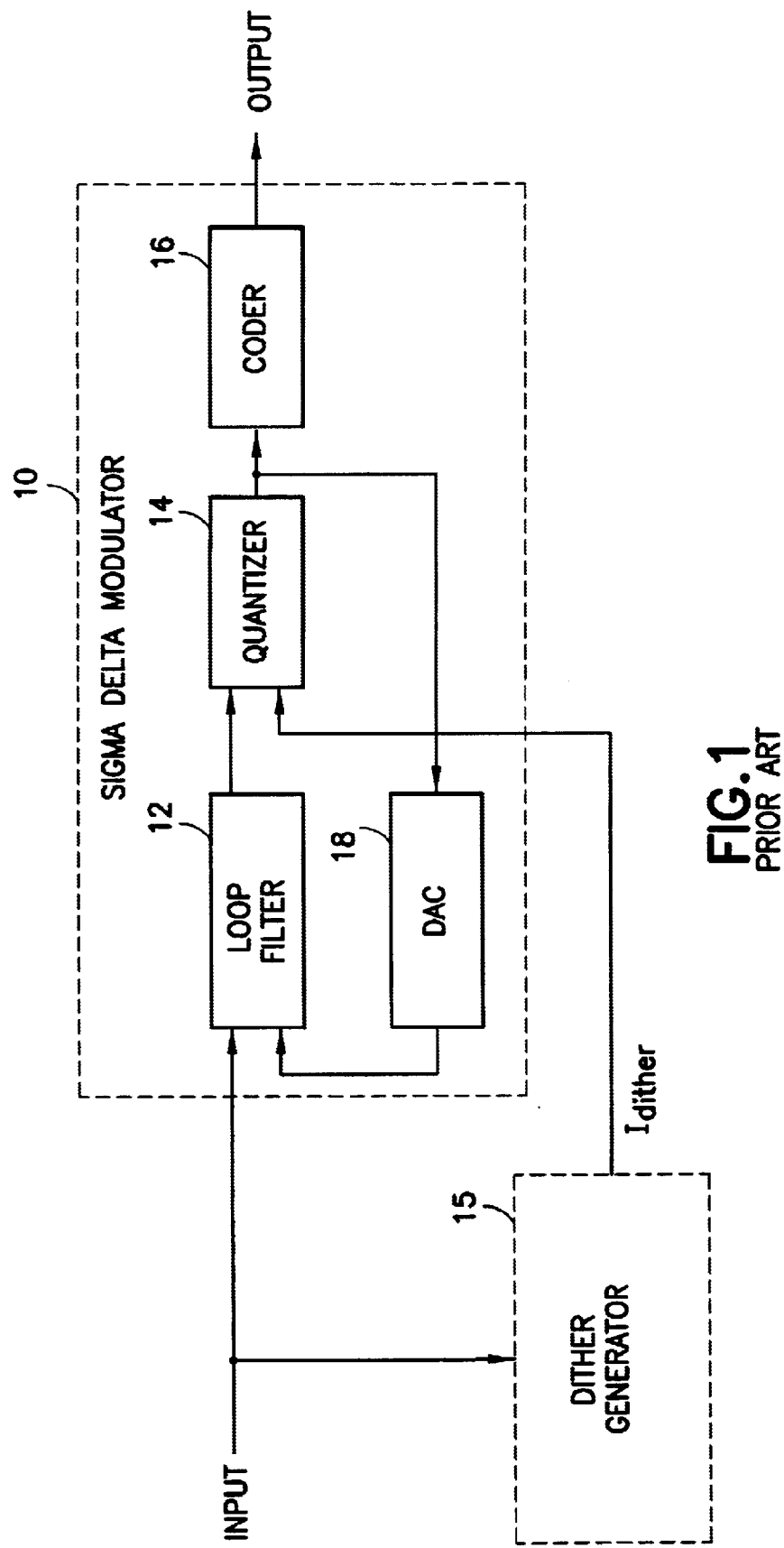
FIG. 1 is a simplified block diagram of a conventional multi-bit SDM having a loop filter, an N-level quantizer, a DAC and a dither signal generator.
Figure 2:
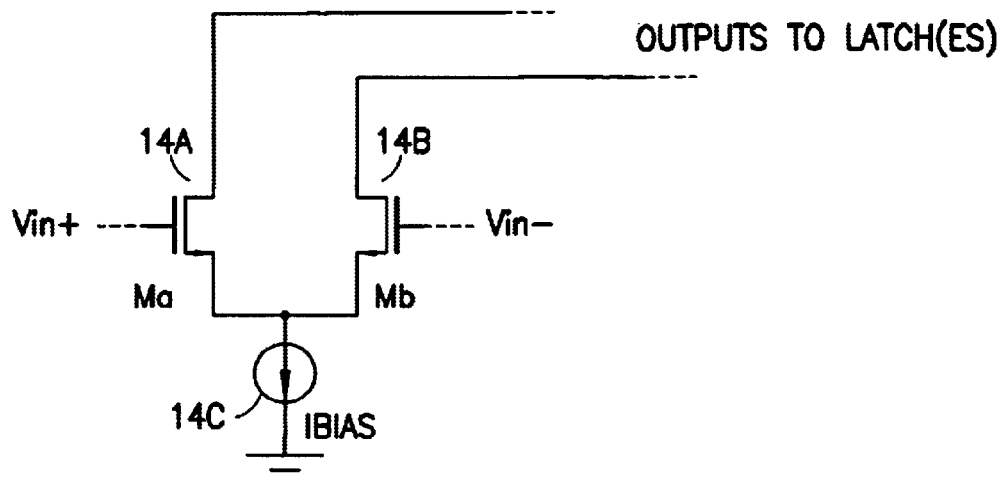
FIG. 2 shows a conventional arrangement of a transistor pair at the input of the quantizer of FIG. 1.

In order to gain a full appreciation of this invention, FIG. 2 shows a conventional arrangement of a transistor pair 14A, 14B at the input of the quantizer 14 of FIG. 1. The transistors 14A and 14B, also referred to as Ma and Mb, are coupled to a common current source 14C, and their outputs are coupled to a quantizer 14 latch or latches. Reference in this regard can be made, for example, to FIGS. 3 and 4 of the above-referenced U.S. Pat. No. 6,445,318 B1.

Figure 4:
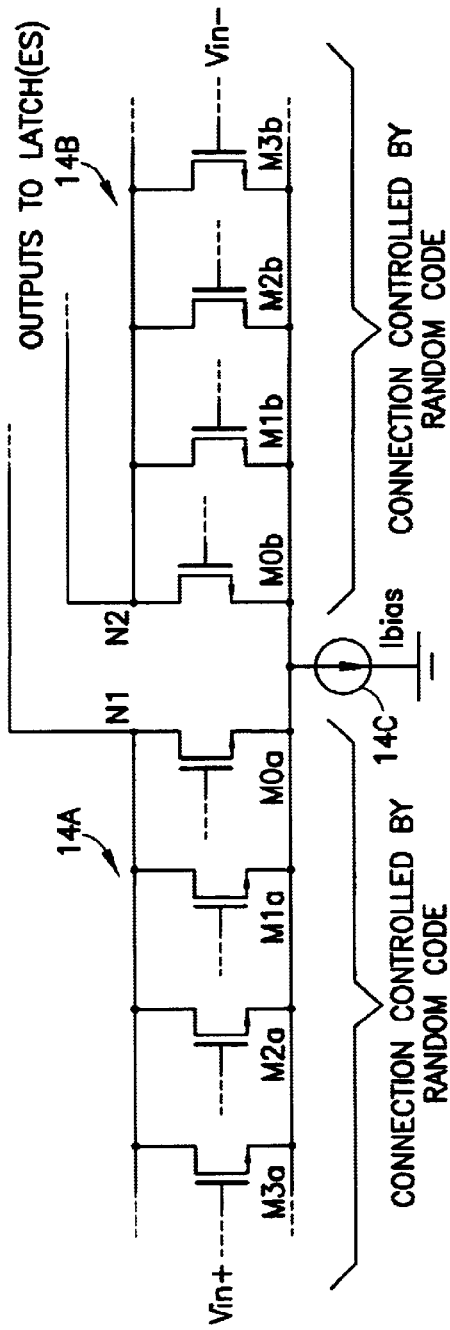
FIG. 4 is a schematic diagram showing a modification to the conventional transistor arrangement of FIG. 2 that is used in accordance with this invention to add or insert a dither signal at the input of the quantizer of the SDM.

Reference is now made to FIG. 4 for illustrating a schematic diagram that shows a modification to the conventional transistor arrangement of FIG. 2, in accordance with this invention. The embodiment of FIG. 4 inserts a dither signal directly at the input of the quantizer 14 of the SDM. This is accomplished by creating a (pseudo)randomly varying offset voltage in the input of the quantizer 14 by means of an artificially created mismatch in the input transistors 14A and 14B. This is done by dividing the original two input transistors into two sets of input transistors comprised of some number (e.g., eight) of transistors M0$a$, M1$a$, M2$a$, M3$a$ (set 1), and M0$b$, M1$b$, M2$b$, M3$b$ (set 2), that are connected in parallel within an input transistor set.

Figure 3:
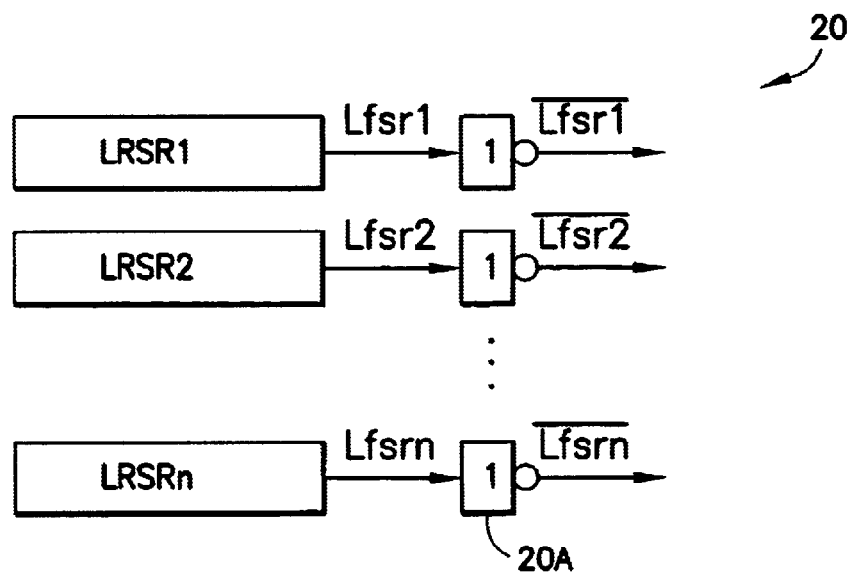
FIG. 3 shows an embodiment of a LFSR that can be used to practice this invention.
Figure 5:
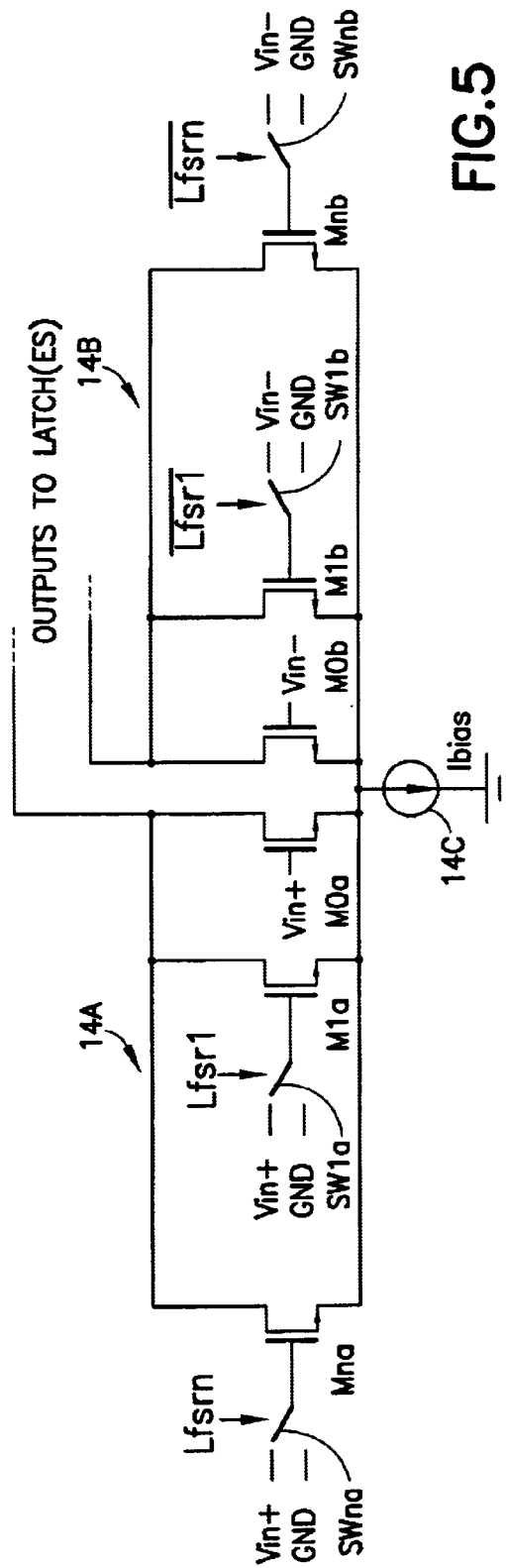
FIG. 5 shows in greater detail a first embodiment of the dither adding circuitry of FIG. 4.

In the preferred embodiment one or more linear feedback shift registers (LFSR) 20, as shown in FIG. 3, are used to generate the pseudo-random code sequences. In the embodiment of FIG. 5, the pseudo-random code sequences are used to control the connection of the inputs of the individual input transistors of each transistor set (shown now as M1$a$, . . . ,Mna and M1$b$, . . . ,Mnb) to ground, or alternatively to the input signal Vin+ and Vin−. The LFSR 20 may be implemented with a chain of data flip-flops (DFFs) and feedback logic composed of EXOR gates. The pseudo-random sequence is of sufficient duration, e.g., seconds or fractions of a second, to impart an appearance of randomness to the dither signal. For example, and depending on the clock frequency, 20 DFFs may be employed to implement each stage (LFSR1, LFSR2, . . . , LFSRn) of the LFSR 20.

The switchable connections to the gates of the transistors M1$a$, . . . ,Mna and M1$b$, . . . ,Mnb are made via switches SW1$a$, . . . ,SWna and SW1$b$, . . . ,SWnb. These switches are preferably implemented using simple FET, or equivalent, switches.

The amplitude of the resulting dither signal is a function of the dimensions of the transistors M0a, . . . ,Mna and M0b, . . . ,Mnb. As such, the ratio of the input signal to the dither signal may be controlled by selection of the aspect ratios (transistor geometry, including channel width) of the input transistors M0a, . . . ,Mna and M0b, . . . ,Mnb.

As the dither signal is random in nature, the use of simple and inaccurate transistor structures can be used to implement the set of dither transistors M0a, . . . ,Mna and M0b, . . . ,Mnb. This enables both the required circuit area and the power consumption to be made small.

Note in FIG. 5 that the normal and inverted outputs of the LFSR 20 are used, with the normal outputs driving dither transistors M1a, . . . ,Mna, and the inverted outputs, generated with inverters 20A, driving M1b, . . . ,Mnb (this arrangement could be revered). This implies, referring by example to FIG. 5, that for a given pair of transistors (e.g., M1a and M1b), that when the gate of one is switched by SW1a to be connected to Vin+, the gate of the other is switched through SW1b to be connected at the same time to ground. This results in the imbalance in the input transistor structure and thereby results in the generation of the desired pseudo-noise dither signal at the input to the quantizer 14.

As a non-limiting example, if the original total width is of each input transistor is W, the modified dimensions could be, for example, M0a $\frac{1}{8}$*W, M1a $\frac{1}{4}$*W, M2a $\frac{1}{2}$*W and M3a 1*W. In this manner the average total width would be $\frac{1}{8}$*W+$\frac{1}{2}$*($\frac{1}{4}$+$\frac{1}{2}$+1)*W=W, i.e. as in the original case. The effective width of each input transistor may vary, by example, from $\frac{1}{8}$*W to $\frac{2\frac{2}{8}}{}$*W.

The circuitry disclosed above in the embodiments of this invention can be implemented in integrated circuits using digital or analog CMOS or BiCMOS integrated circuit technologies, as examples.

The use of this invention can be advantageous for generating dither in audio and RF ADCs, both single and multi-bit. The invention can be employed for both SC and continuous time SDMs.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims.

As one example, the use of more or less than four transistors on each side of the quantizer input can be employed. Furthermore, this invention is not limited for use in differential circuit configurations, as single ended configurations can also benefit from the use of this invention. Also, various random or pseudo-random signal generators, other than LFSRs, can be employed, such as one triggered from Schott noise generated by a pn junction.

Also in some embodiments the gates of the set of additional transistors need not be coupled to circuit ground, but may be coupled to another signal, such as a predetermined voltage potential, that results in the transistor(s) being in an inactive state.

However, all such and similar modifications of the teachings of this invention will still fall within the scope of this invention. Further, while the method and apparatus described herein are provided with a certain degree of specificity, the present invention could be implemented with either greater or lesser specificity, depending on the needs of the user. Further, some of the features of the present invention could be used to advantage without the corresponding use of other features. As such, the foregoing description should be considered as merely illustrative of the principles of the present invention, and not in limitation thereof, as this invention is defined by the claims which follow.

What is claimed is:

1. A method to generate a dither signal in a sigma-delta modulator, comprising:

at an input of a quantizer, dividing at least one input transistor into a set of transistors connected together in parallel;

generating a digital signal having random or pseudo-random characteristics; and activating individual transistors of the set of transistors with the digital signal to generate a noise signal that is added to an output of the input transistor.

2. A method as in claim 1, where there is a first input transistor and a second input transistor, and where said first input transistor is divided into a first set of transistors connected in parallel, and said second input transistor is divided into a second set of transistors connected in parallel.

3. A method as in claim 2, where a gate of each individual transistor in each of the first and second sets is switchably coupled by the digital signal to either an input signal in an active state or to another signal in an inactive state.

4. A method as in claim 3, where the another signal comprises circuit ground.

5. A method as in claim 2, where the input of the quantizer inputs a differential input signal via the first and second input transistors.

6. A method as in claim 1, where at least one channel dimension of the transistors of the set of transistors differs from a channel dimension of at least two of transistors of the set of transistors.

7. A sigma-delta modulator, comprising:

an input node coupled to a first input of a loop filter;

a quantizer having an input coupled to an output of the loop filter for receiving a differential input signal therefrom; and a feedback path coupled from an output of said quantizer to a second input of said loop filter;

said quantizer input comprising a first input signal transistor divided into a first set of transistors connected in parallel, and a second input signal transistor divided into a second set of transistors connected in parallel.

8. A sigma-delta modulator as in claim 7, where the gate of each individual transistor in the first set is switchably coupled by a digital signal to either an input signal (active state) or to ground (inactive state), and the gate of each individual transistor in the second set is switchably coupled by an inverse of the digital signal to either the input signal (active state) or to ground (inactive state).

9. A sigma-delta modulator as in claim 8, where said digital signal is generated to have random or pseudo-random characteristics.

10. A sigma-delta modulator as in claim 8, where the voltage signals comprise the input voltage signals.

11. A sigma-delta modulator as in claim 8, where the input signal comprises the differential input signal.

12. A sigma-delta modulator as in claim 7, where at least one channel dimension of the transistors of the set of parallel-connected transistors differs from at least one channel dimension of the other transistors of the other set of parallel-connected transistors.

13. A sigma-delta modulator as in claim 7, where a gate of each transistor of said first set of transistors is switchably coupled by a digital signal having pseudo-random characteristics to either the input signal or to ground, and where a gate of each transistor of said second set of transistors is switchably coupled by an inverted version of the digital signal to either the input signal or to ground for creating an imbalance in a quantizer input transistor structure that results in the generation of a desired pseudo-noise dither signal at said input to said quantizer.

14. A sigma-delta modulator, comprising:

an input node coupled to a first input of a loop filter;

a quantizer comprising a plurality of input transistors coupled to an output of the loop filter for receiving a differential input signal therefrom;

a feedback path coupled from an output of said quantizer to a second input of said loop filter; and means for creating an offset in said quantizer input transistors that results in the generation of a desired pseudo-noise dither signal at said input to said quantizer.

15. A sigma-delta modulator as in claim 14, where said quantizer input transistors comprise a first input signal transistor divided into a first set of transistors connected in parallel, and a second input signal transistor divided into a second set of transistors connected in parallel, where said means for creating an imbalance comprises a gate of each individual transistor in the first set being switchably coupled by a digital signal to either said input signal or to potential resulting in an inactive transistor state and a gate of each individual transistor in the second set being switchably coupled by an inverse of the digital signal to either the input signal or to the potential, where said digital signal is generated to have random or pseudo-random characteristics.

16. A sigma-delta modulator as in claim 14, where said quantizer input transistors comprise a first input signal transistor divided into a first set of transistors connected in parallel, and a second input signal transistor divided into a second set of transistors connected in parallel, where at least one transistor in each of said first and second sets has a channel dimension that differs from a channel dimension of at least one other transistor in the respective one of the first or second sets.

* * * * *